United States Patent
Kim et al.

(10) Patent No.: US 11,487,197 B2
(45) Date of Patent: Nov. 1, 2022

(54) PHASE SHIFT MASKS FOR EXTREME ULTRAVIOLET LITHOGRAPHY

(71) Applicant: Samsung Electronics Co., Ltd., Suwon-si (KR)

(72) Inventors: Seongsue Kim, Seoul (KR); Dongwan Kim, Seongnam-si (KR); Hwanseok Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 162 days.

(21) Appl. No.: 17/120,480

(22) Filed: Dec. 14, 2020

(65) Prior Publication Data

US 2021/0318608 A1    Oct. 14, 2021

(30) Foreign Application Priority Data

Apr. 14, 2020  (KR) .................. 10-2020-0045379

(51) Int. Cl.
*G03F 1/26* (2012.01)
*G03F 1/24* (2012.01)

(52) U.S. Cl.
CPC . *G03F 1/26* (2013.01); *G03F 1/24* (2013.01)

(58) Field of Classification Search
CPC ..................................... G03F 1/24; G03F 1/26

USPC ............................................................ 430/5
See application file for complete search history.

(56) References Cited

U.S. PATENT DOCUMENTS

| 9,625,805 | B2 | 4/2017 | Sakai et al. |
| 9,864,267 | B2 | 1/2018 | Ikebe et al. |
| 10,481,484 | B2 | 11/2019 | Ikebe et al. |
| 2017/0176851 | A1 | 6/2017 | Peters et al. |
| 2019/0384156 | A1 | 12/2019 | Tanabe |

FOREIGN PATENT DOCUMENTS

| JP | 5282507 | B2 | 6/2013 |
| JP | 5549264 | B2 | 5/2014 |
| JP | 5685951 | B2 | 1/2015 |
| JP | 6343690 | B2 | 5/2018 |
| JP | 2019144357 | A | 8/2019 |

*Primary Examiner* — Christopher G Young
(74) *Attorney, Agent, or Firm* — Myers Bigel, P.A.

(57) ABSTRACT

Phase shift masks for an extreme ultraviolet lithography process includes a substrate, a reflection layer on the substrate, a capping layer on the reflection layer, and phase shift patterns on the capping layer. Each of the phase shift patterns may include a lower absorption pattern on the capping layer and an upper absorption pattern on the lower absorption pattern. A refractive index of the upper absorption pattern may be higher than a refractive index of the lower absorption pattern, and a thickness of the upper absorption pattern is smaller than a thickness of the lower absorption pattern.

20 Claims, 9 Drawing Sheets

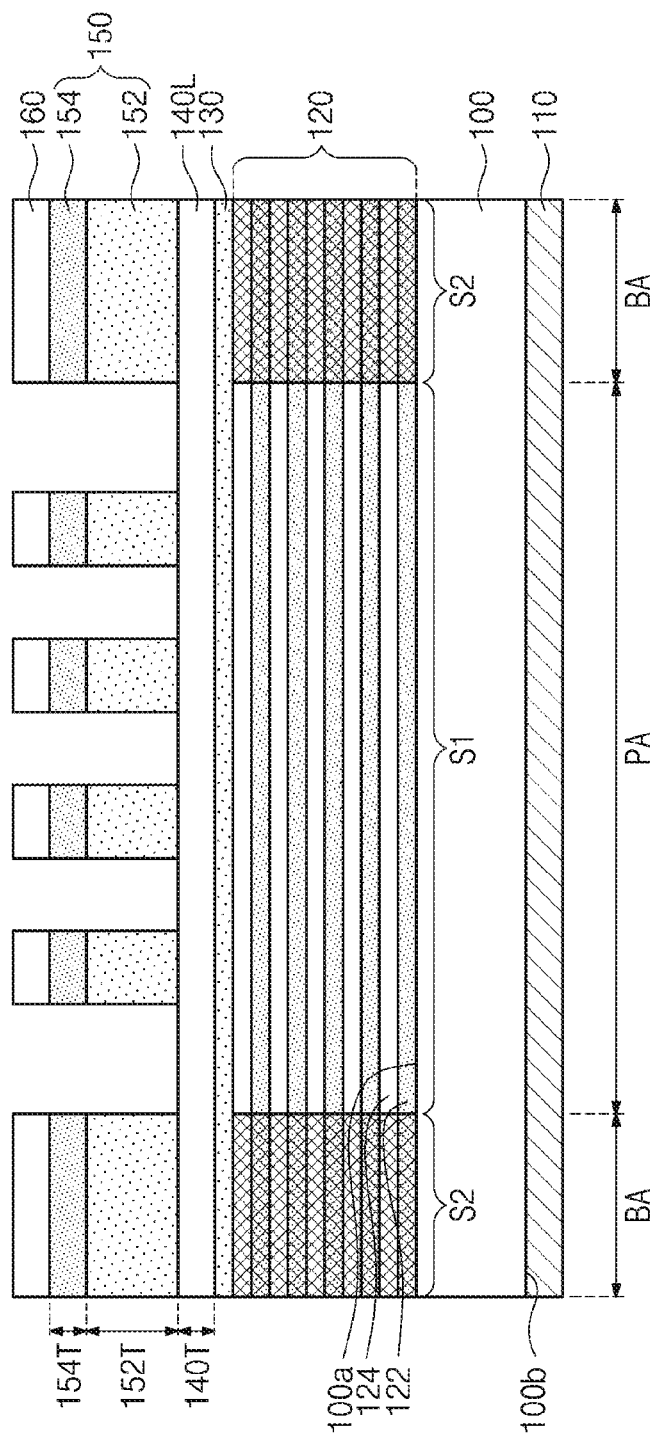

PHASE SHIFT MASKS FOR EXTREME ULTRAVIOLET LITHOGRAPHY

CROSS-REFERENCE TO RELATED APPLICATION

This U.S. non-provisional patent application claims priority under 35 U.S.C. § 119 to Korean Patent Application No. 10-2020-0045379, filed on Apr. 14, 2020, in the Korean Intellectual Property Office, the entire contents of which are hereby incorporated by reference.

BACKGROUND OF THE INVENTION

The present disclosure relates to a mask for an extreme ultraviolet lithography process, and in particular, to a phase shift mask for an extreme ultraviolet lithography process.

A reduction in size and design rule of a semiconductor device increases a demand for a technique to reduce a size of a pattern (e.g., elements in the semiconductor device). In order to meet such a demand, a light source, which is configured to emit light of a shorter wavelength, has been used in a lithography process. For example, light having wavelengths of about 436 nm ("g-line"), 365 nm ("i-line"), 248 nm (e.g., of KrF laser), and 193 nm (e.g., ArF laser) have been used as light sources in the lithography process. Recently, the extreme ultraviolet (EUV) light having a wavelength of about 13.5 nm has been suggested as a light source for EUV lithography.

Because most of the EUV light is absorbed by refractive optical materials, a reflective optical system, instead of a refractive optical system, is used in the EUV lithography.

SUMMARY

Example embodiments of the inventive concept provide a phase shift mask which is used for an extreme ultraviolet lithography process and has an improved contrast property.

Example embodiments of the inventive concept provide a phase shift mask which can realize a high resolution image in an extreme ultraviolet lithography process.

According to some embodiments of the inventive concept, a phase shift mask for an extreme ultraviolet lithography process may include a substrate, a reflection layer on the substrate, a capping layer on the reflection layer, and phase shift patterns on the capping layer. Each of the phase shift patterns may include a lower absorption pattern on the capping layer and an upper absorption pattern on the lower absorption pattern. A refractive index of the upper absorption pattern may be higher than a refractive index of the lower absorption pattern, and a thickness of the upper absorption pattern may be smaller than a thickness of the lower absorption pattern. The capping layer, the lower absorption pattern, and the upper absorption pattern may be sequentially stacked on the substrate.

According to some embodiments of the inventive concept, a phase shift mask for an extreme ultraviolet lithography process may include a substrate, a reflection layer on the substrate, a capping layer on the reflection layer, buffer patterns on the capping layer, and phase shift patterns on the buffer patterns, respectively. Each of the phase shift patterns may include an upper absorption pattern on each of the buffer patterns and a lower absorption pattern between the each of the buffer patterns and the upper absorption pattern. The lower absorption pattern and the capping layer may include the same metallic element. The upper absorption pattern may have a refractive index that is higher than a refractive index of the lower absorption pattern. A thickness of the upper absorption pattern may be smaller than a thickness of the lower absorption pattern.

According to some embodiments of the inventive concept, a phase shift mask for an extreme ultraviolet lithography process may include a substrate, a reflection layer on the substrate, a capping layer on the reflection layer, and phase shift patterns on the capping layer. Each of the phase shift patterns may include a lower absorption pattern on the capping layer and an upper absorption pattern on the lower absorption pattern. The lower absorption pattern may include ruthenium (Ru) and the upper absorption pattern may include tantalum (Ta). A thickness of the upper absorption pattern may be smaller than a thickness of the lower absorption pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 9 to 12 are sectional views illustrating a method of fabricating a phase shift mask according to some embodiments of the inventive concept.

DETAILED DESCRIPTION

Example embodiments of the inventive concept will now be described more fully with reference to the accompanying drawings, in which example embodiments are shown.

Figure 1:
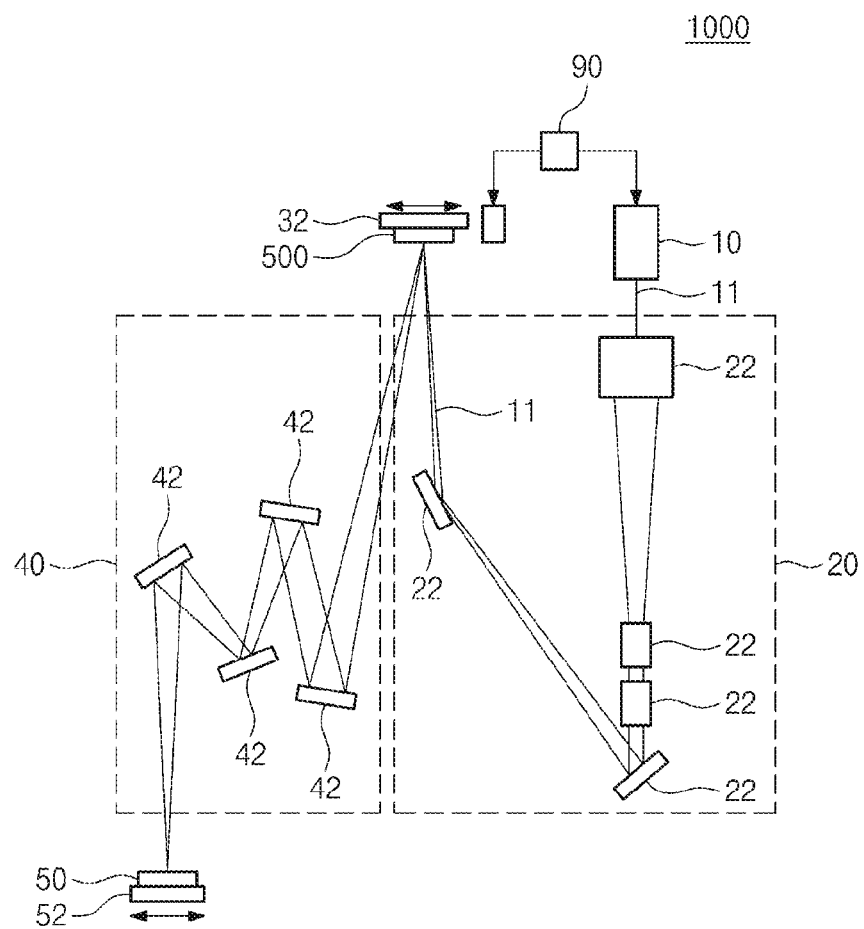
FIG. 1 is a conceptual diagram illustrating an extreme ultraviolet (EUV) lithography system using a phase shift mask, according to some embodiments of the inventive concept.

FIG. 1 is a conceptual diagram illustrating an extreme ultraviolet (EUV) lithography system using a phase shift mask, according to some embodiments of the inventive concept.

Referring to FIG. 1, an extreme ultraviolet lithography system 1000 may include an optical source unit 10, a condenser unit 20, a projection unit 40, and a control unit 90.

The optical source unit 10 may generate an extreme ultraviolet light 11 (e.g., having a wavelength of about 13.5 nm). The condenser unit 20 may guide an extreme ultraviolet light 11, which is produced by the optical source unit 10, such that the extreme ultraviolet light 11 is incident into a phase shift mask 500. The condenser unit 20 may include a condenser optics 22 (e.g., a lens and/or a mirror). The condenser optics 22 may condense and reflect the extreme ultraviolet light 11 to guide the extreme ultraviolet light 11 to the phase shift mask 500. The extreme ultraviolet light 11 may be slantingly incident into the phase shift mask 500 through the condenser unit 20.

The phase shift mask 500 may be provided on a mask stage 32, and the mask stage 32 may be configured to move the phase shift mask 500. The optical source unit 10 and the mask stage 32 may be controlled by the control unit 90.

The extreme ultraviolet light 11, which is incident into the phase shift mask 500, may be reflected by the phase shift mask 500 and then may be incident into the projection unit 40. The projection unit 40 may be configured to project a mask pattern image of the phase shift mask 500 onto a wafer 50. The projection unit 40 may include a projection optics 42 (e.g., a lens and/or a mirror). The projection optics 42 may be configured to project the mask pattern image of the phase shift mask 500 onto the wafer 50 in a reduction projection manner (e.g., by 4, 6, or 8 times) using the extreme ultraviolet light 11, which is reflected by the phase shift mask 500. Since the extreme ultraviolet light 11 is irradiated onto the wafer 50 through the projection unit 40, patterns corresponding to the mask pattern image of the phase shift mask 500 may be printed on the wafer 50. The wafer 50 may be loaded on a wafer stage 52, and the wafer stage 52 may be configured to move the wafer 50 (e.g., to place a desired region of the wafer 50 at an exposure region). As used herein, the term "patterns" refers to portions of a layer or stacked layers formed on a substrate (e.g., a wafer) by a patterning process that may include a lithography process and/or an etching process. Further, the term "and/or" as used herein includes any and all combinations of one or more of the associated listed items.

Figure 2:
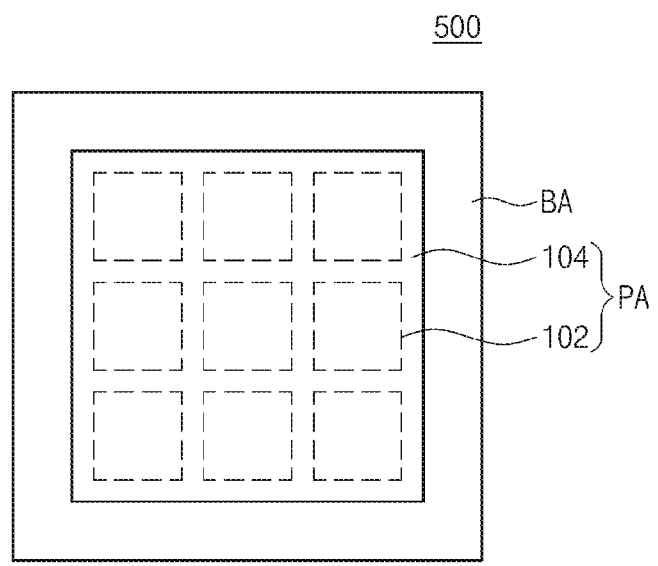
FIG. 2 is a plan view schematically illustrating a phase shift mask according to some embodiments of the inventive concept.
Figure 3:
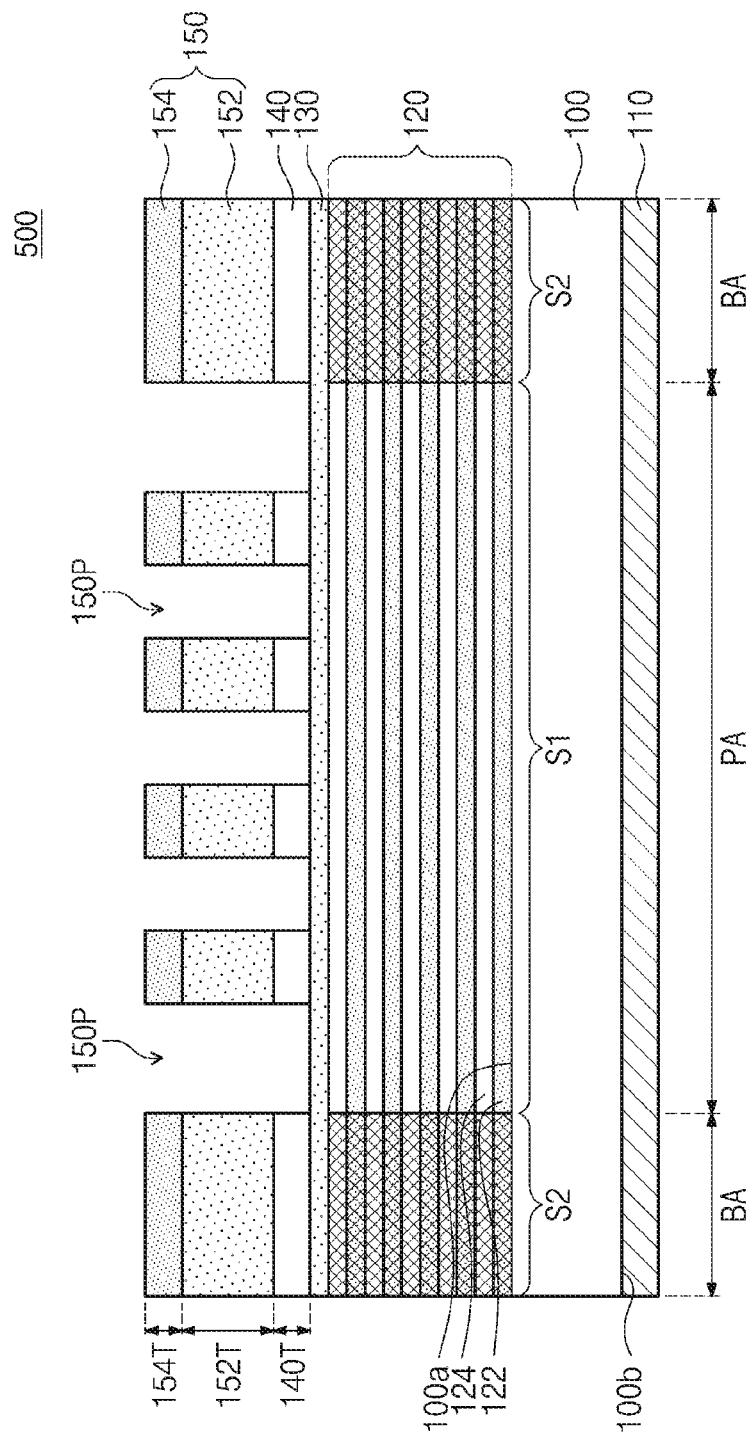
FIG. 3 is a sectional view schematically illustrating a phase shift mask according to some embodiments of the inventive concept.
Figure 4:
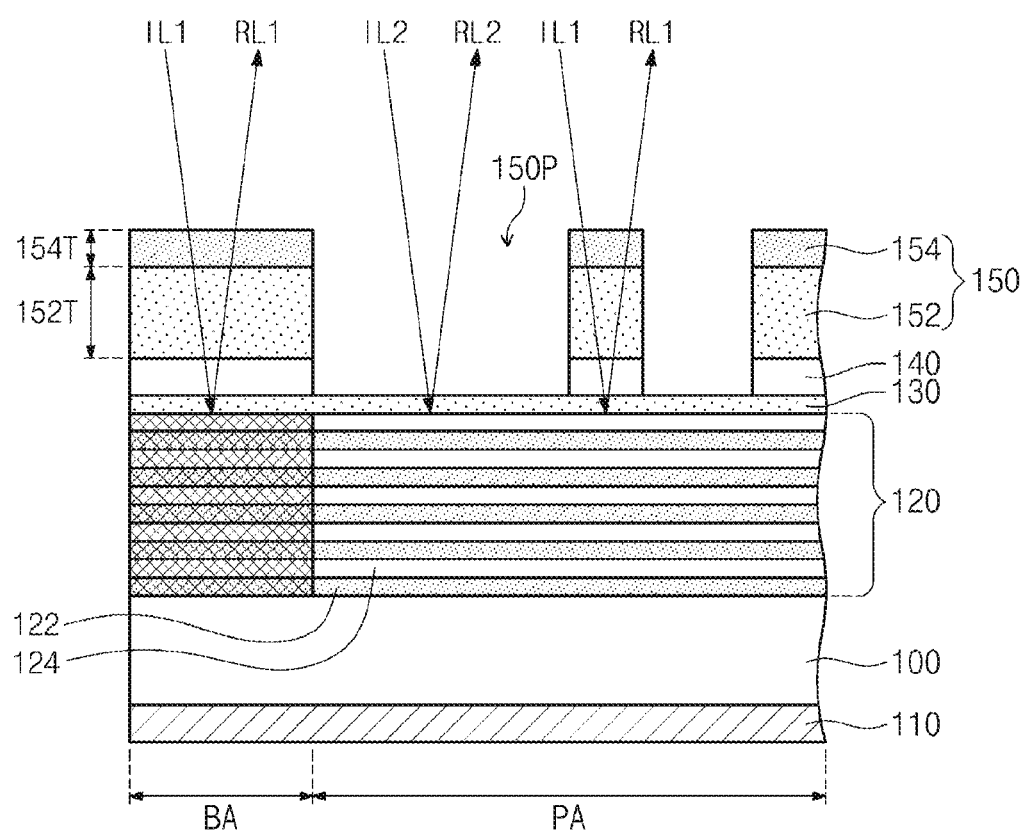
FIG. 4 is an enlarged view illustrating a portion of the phase shift mask of FIG. 3.

FIG. 2 is a plan view schematically illustrating a phase shift mask according to some embodiments of the inventive concept, and FIG. 3 is a sectional view schematically illustrating a phase shift mask according to some embodiments of the inventive concept. FIG. 4 is an enlarged view illustrating a portion of the phase shift mask of FIG. 3.

Referring to FIGS. 2 and 3, the phase shift mask 500 may include a substrate 100, a reflection layer 120, a capping layer 130, buffer patterns 140, phase shift patterns 150, and a lower conductive layer 110. The phase shift mask 500 may be a reflection-type phase shift mask.

The substrate 100 may be formed of or include a material having a low thermal expansion coefficient. As an example, the substrate 100 may be formed of or include glass or silicon (Si). The substrate 100 may include a pattern region PA, in which patterns to be transcribed onto a wafer are disposed, and a black border region BA around the pattern region PA. The pattern region PA may include a main pattern region 102 and a sub-pattern region 104. The main pattern region 102 may be a region, which is used to transcribe main patterns constituting an integrated circuit onto a chip region of a wafer (e.g., the wafer 50 of FIG. 1), and the sub-pattern region 104 may be a region, which is used to transcribe auxiliary patterns onto a scribe line region of the wafer (e.g., the wafer 50 of FIG. 1). The border region BA may be adjacent to the pattern region PA. For example, the black border region BA may be provided to enclose or surround (e.g., to partially enclose) the pattern region PA, when viewed in a plan view. The black border region BA may completely enclose the pattern region PA in a plan view as illustrated in FIG. 2. Although not shown, alignment and/or identification marks, which are used to align and/or identify the phase shift mask 500 in the lithography system 1000 of FIG. 1, may be disposed on the black border region BA.

The reflection layer 120 may be disposed on a first surface 100a of the substrate 100. The reflection layer 120 may be disposed on the pattern region PA and may be extended onto the black border region BA. The reflection layer 120 may reflect light (e.g., the extreme ultraviolet light 11 of FIG. 1), which is incident into the reflection layer 120. The reflection layer 120 may be configured to serve as a Bragg reflector. As an example, the reflection layer 120 may include a multi-layered structure, in which low refractive index layers 122 and high refractive index layers 124 are alternately and repeatedly stacked. As an example, each of the numbers of the low and high refractive index layers 122 and 124, which are stacked in the reflection layer 120, may be about 40 to about 60. The low refractive index layers 122 may be formed of or include, for example, molybdenum (Mo), and the high refractive index layers 124 may be formed of or include, for example, silicon (Si). In some embodiments, the lowermost one of the low refractive index layers 122 may be disposed at the lowermost level of the reflection layer 120, and the uppermost one of the high refractive index layers 124 may be disposed at the uppermost level of the reflection layer 120. A layer of the reflection layer 120, which is closest to the substrate 100, may be one of the low refractive index layers 122, and a layer of the reflection layer 120, which is farthest from the substrate 100, may be one of the high refractive index layers 124.

In some embodiments, the reflection layer 120 may have a multi-layered structure S1, in which the low and high refractive index layers 122 and 124 are alternately stacked, on the pattern region PA, and an intermixed structure S2, in which the low and high refractive index layers 122 and 124 are intermixed, on the black border region BA. In this case, reflectance of light (e.g., the extreme ultraviolet light 11 of FIG. 1) to be incident into the black border region BA may be reduced.

The capping layer 130 may be disposed on the first surface 100a of the substrate 100 and on the reflection layer 120. The reflection layer 120 may be interposed between the capping layer 130 and the substrate 100. The capping layer 130 may be disposed on the pattern region PA and may be extended onto the black border region BA. The capping layer 130 may protect the reflection layer 120 and may reduce or prevent oxidation of a surface of the reflection layer 120. The capping layer 130 may be formed of or include a metallic element (e.g., ruthenium (Ru)).

The phase shift patterns 150 may be disposed on the first surface 100a of the substrate 100 and on the capping layer 130. The capping layer 130 may be interposed between the phase shift patterns 150 and the reflection layer 120. The phase shift patterns 150 may be disposed on the pattern region PA and the black border region BA, and openings 150P between the phase shift patterns 150 may be provided to expose a top surface of the capping layer 130.

The buffer patterns 140 may be disposed on the first surface 100a of the substrate 100 and between the phase shift patterns 150 and the capping layer 130. Each of the buffer patterns 140 may be interposed between each of the phase shift patterns 150 and the capping layer 130. The openings 150P may be extended into a region between the buffer patterns 140 to expose the top surface of the capping layer 130. In some embodiments, the buffer patterns 140 (e.g., a lower surface of the buffer patterns 140) may directly contact the capping layer 130 (e.g. an upper surface of the capping layer 130) as illustrated in FIG. 3.

Each of the phase shift patterns 150 may include a lower absorption pattern 152 and an upper absorption pattern 154 on the lower absorption pattern 152. The lower absorption pattern 152 may be disposed between each of the buffer patterns 140 and the upper absorption pattern 154. In some embodiments, the lower absorption pattern 152 may directly contact both the upper absorption pattern 154 and the buffer pattern 140 as illustrated in FIG. 3. The upper absorption pattern 154 may be formed of or include a material whose refractive index (n) is higher than that of the lower absorption pattern 152. In other words, the refractive index of the upper absorption pattern 154 may be greater than the refractive index of the lower absorption pattern 152. In addition, the upper absorption pattern 154 may be formed of or include a material whose extinction coefficient (k) is higher than that of the lower absorption pattern 152. In other words, the extinction coefficient of the upper absorption pattern 154 may be greater than the extinction coefficient of the lower absorption pattern 152. The upper absorption pattern 154 may be formed of or include tantalum alloys and/or tantalum nitride. As an example, the upper absorption pattern 154 may be formed of or include TaN, TaBN, and/or TaSi. The lower absorption pattern 152 may be formed of or include ruthenium (Ru). As an example, the lower absorption pattern 152 may be formed of or include ruthenium, ruthenium alloys, ruthenium oxide, ruthenium nitride, and/or ruthenium oxynitride.

Each of the upper and lower absorption patterns 154 and 152 may have a thickness, which is measured in a direction perpendicular to the first surface 100a of the substrate 100. A thickness 154T of the upper absorption pattern 154 may be smaller than a thickness 152T of the lower absorption pattern 152.

The capping layer 130 may be formed of or include the same metallic element (e.g., ruthenium (Ru)) as the lower absorption pattern 152, and the buffer patterns 140 may be formed of or include a material different from the capping layer 130 and the lower absorption pattern 152. The buffer patterns 140 may include a material having an etch selectivity with respect to the capping layer 130 and the lower absorption pattern 152. The buffer patterns 140 may be formed of or include, for example, silicon, silicon oxide, silicon nitride, silicon oxynitride, tantalum oxide, and/or tantalum oxynitride. In some embodiments, the buffer patterns 140 may be formed of or include SiN, SiO, SiON, TaO, TaON, TaBO, and/or TaBON. Each of the buffer patterns 140 may have a thickness 140T, which is measured in the direction perpendicular to the first surface 100a of the substrate 100, and the thickness 140T of each of the buffer patterns 140 may be smaller than the thickness 152T of the lower absorption pattern 152.

The lower conductive layer 110 may be disposed on a second surface 100b of the substrate 100, which is opposite to the first surface 100a of the substrate 100. The lower conductive layer 110 may be spaced apart from the reflection layer 120 with the substrate 100 interposed therebetween. The lower conductive layer 110 may be formed of or include a conductive material (e.g., CrN).

Referring to FIGS. 3 and 4, the phase shift patterns 150 may absorb a portion of an extreme ultraviolet light IL1, which is incident into the first surface 100a of the substrate 100. Accordingly, reflectance of the extreme ultraviolet light IL1 incident into the phase shift patterns 150 may be smaller than reflectance of an extreme ultraviolet light IL2 incident into the openings 150P. The reflectance of the extreme ultraviolet light IL1 incident into the phase shift patterns 150 may be dependent on an extinction coefficient (k) of a material constituting the phase shift patterns 150 and a thickness of the phase shift patterns 150. As an example, the smaller the extinction coefficient (k) of the material constituting the phase shift patterns 150 and the smaller the thickness of the phase shift patterns 150, the higher the reflectance of the extreme ultraviolet light IL1 incident into the phase shift patterns 150.

The phase shift patterns 150 may be configured to lead to a phase shift of an extreme ultraviolet light RL1, which passes through the phase shift patterns 150 and is reflected by the reflection layer 120. Accordingly, a phase of the extreme ultraviolet light RL1, which passes through the phase shift patterns 150 and is reflected by the reflection layer 120, may be different from a phase of an extreme ultraviolet light RL2, which passes through the openings 150P and is reflected by the reflection layer 120. An amount of phase shift of the extreme ultraviolet light RL1, which passes through the phase shift patterns 150 and is reflected by the reflection layer 120, may be changed depending on a refractive index (n) of a material constituting the phase shift patterns 150 and a thickness of the phase shift patterns 150. As an example, the smaller the refractive index of the material constituting the phase shift patterns 150 and the larger the thickness of the phase shift patterns 150, the larger the amount of phase shift of the extreme ultraviolet light RL1, which passes through the phase shift patterns 150 and is reflected by the reflection layer 120.

The smaller the refractive index (n) of the material constituting the phase shift patterns 150, the larger the amount of the extreme ultraviolet light IL1, which is incident into the phase shift patterns 150 and is reflected from surfaces of the phase shift patterns 150. In this case, the phase shift mask 500 may have a deteriorated mask contrast property.

According to some embodiments of the inventive concept, the lower absorption pattern 152 may have a refractive index (n), which is smaller than the upper absorption pattern 154, and the thickness 152T of the lower absorption pattern 152 may be greater than the thickness 154T of the upper absorption pattern 154. Accordingly, the amount of phase shift of the extreme ultraviolet light RL1, which passes through the phase shift patterns 150 and is reflected by the reflection layer 120, may be increased, and in this case, it may be easy to realize a high-resolution image using the phase shift mask 500.

Furthermore, the upper absorption pattern 154 may have a refractive index (n), which is greater than the lower absorption pattern 152, and thus, it may be possible to reduce an amount of the extreme ultraviolet light IL1, which is incident into the phase shift patterns 150 and is reflected from the surfaces of the phase shift patterns 150. In some embodiments, the upper absorption pattern 154 may have an extinction coefficient (k), which is greater than the lower absorption pattern 152, and thus, it may be possible to reduce the reflectance of the extreme ultraviolet light IL1 incident into the phase shift patterns 150. In this case, it may be possible to improve a mask contrast property of the phase shift mask 500.

Figure 5:
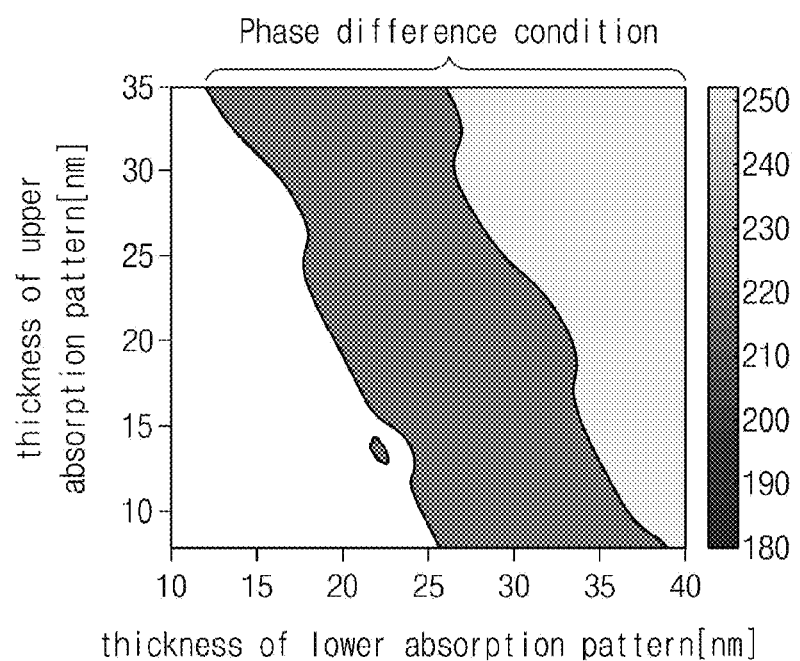
FIG. 5 is a graph showing an amount of phase shift of an incident light versus thicknesses of phase shift patterns of a phase shift mask, according to some embodiments of the inventive concept.

FIG. 5 is a graph showing an amount of phase shift of an incident light versus thicknesses of phase shift patterns of a phase shift mask, according to some embodiments of the inventive concept.

Referring to FIGS. 4 and 5, the phase shift patterns 150 may be configured to alter a phase difference of about 180° to about 250° between the extreme ultraviolet light RL1, which passes through the phase shift patterns 150 and is reflected by the reflection layer 120, and the extreme ultraviolet light RL2, which passes through the openings 150P and is reflected by the reflection layer 120 (hereinafter, a phase difference condition). The thickness 154T of the upper absorption pattern 154 and the thickness 152T of the lower absorption pattern 152 may be adjusted to meet the phase difference condition. As an example, the thickness 154T of the upper absorption pattern 154 may range from about 8 nm to about 35 nm, and the thickness 152T of the lower absorption pattern 152 may range from about 10 nm to about 40 nm.

Since the phase shift patterns 150 is configured to meet the phase difference condition, the extreme ultraviolet light RL1, which passes through the phase shift patterns 150 and is reflected by the reflection layer 120, may destructively interfere with the extreme ultraviolet light RL2, which passes through the openings 150P and is reflected by the reflection layer 120. In the case where an exposure process using the phase shift mask 500 is performed on a photoresist layer formed on the wafer 50 of FIG. 1, an intensity of an extreme ultraviolet light, which is incident into regions of the photoresist layer corresponding to the phase shift patterns 150, may be decreased, due to the destructive interference between the extreme ultraviolet lights RL1 and RL2. In other words, an image, which is projected on the photoresist layer, may have a high normalized-image-log-slope (NISL), and this may make it easy to realize a high-resolution image on the photoresist layer.

Figure 6:
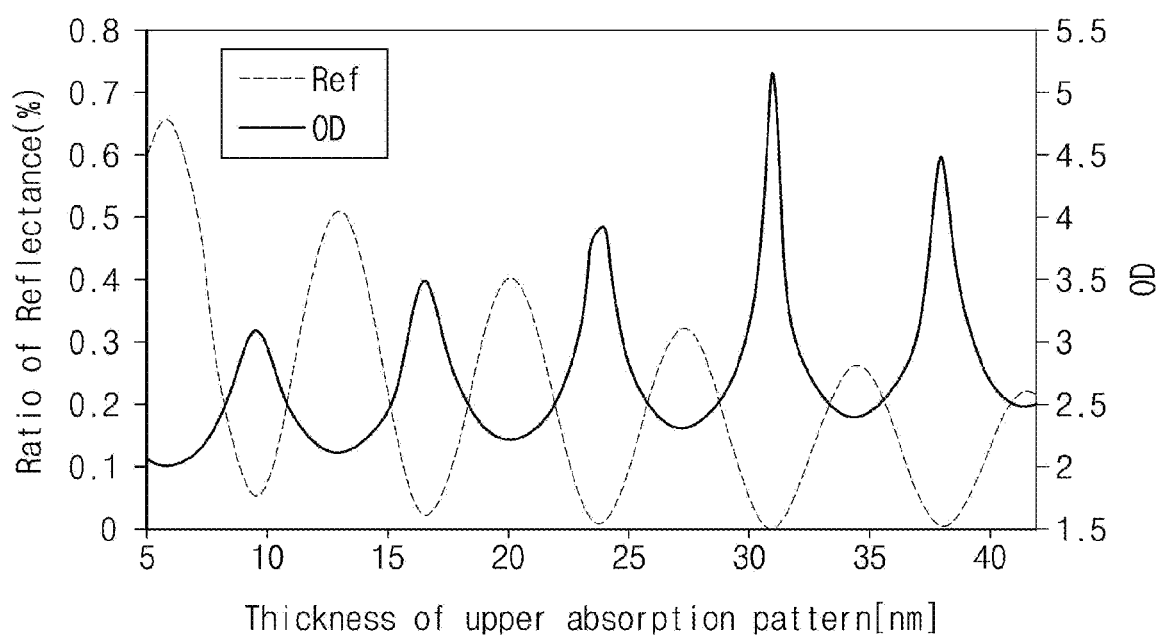
FIGS. 6 and 7 are graphs, each of which shows an optical density (OD) property versus a thickness of an upper absorption pattern of a phase shift mask, according to some embodiments of the inventive concept.
Figure 7:
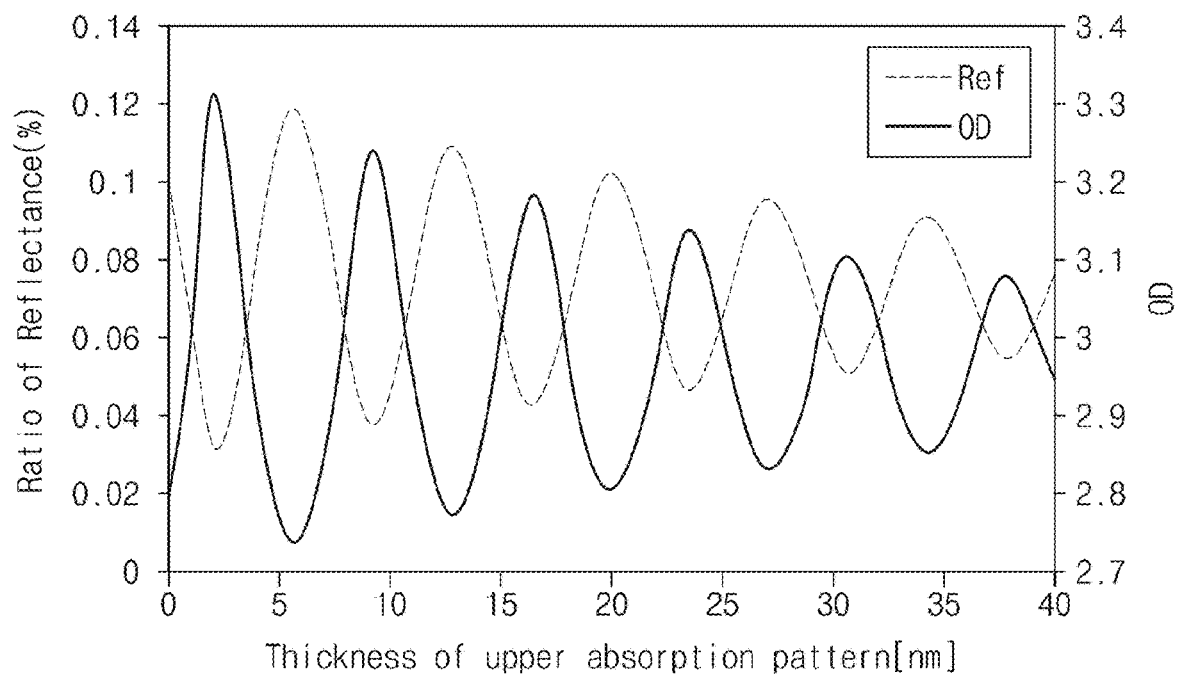

FIGS. 6 and 7 are graphs, each of which shows an optical density (OD) property versus a thickness of an upper absorption pattern (e.g., the upper absorption pattern 154 in FIG. 4) of a phase shift mask, according to some embodiments of the inventive concept.

Referring to FIGS. 4, 6, and 7, the mask contrast property of the phase shift mask 500 may be evaluated by the following formula 1:

$$OD = -\log(Ra/Rb) \quad \text{[Formula 1]}$$

where Ra is the reflectance of the extreme ultraviolet light IL1 incident into the phase shift patterns 150, Rb is the reflectance of the extreme ultraviolet light IL2 incident into the openings 150P, and OD is an optical density representing an extent of light-blocking property.

In some embodiments, the black border region BA is needed to have the optical density (OD) of 2.8 or higher. Hereinafter, this condition (OD≥2.8) will be referred to as an optical density condition.

FIG. 6 shows optical density (OD) and reflectance ratio (Ra/Rb) properties of the black border region BA versus the thickness 154T of the upper absorption pattern 154, when the thickness 152T of the lower absorption pattern 152 is 32 nm. FIG. 6 shows that the optical density (OD) condition (i.e., OD≥2.8) for the black border region BA can be satisfied when the thickness 152T of the lower absorption pattern 152 is 32 nm and the thickness 154T of the upper absorption pattern 154 has values close to 9.5 nm, 16.5 nm, 24 nm, 31 nm, and 38 nm.

FIG. 7 shows optical density (OD) and reflectance ratio (Ra/Rb) properties of the black border region BA versus the thickness 154T of the upper absorption pattern 154 when the thickness 152T of the lower absorption pattern 152 is 30 nm. FIG. 7 shows that the optical density (OD) condition (i.e., OD≥2.8) for the black border region BA can be satisfied when the thickness 152T of the lower absorption pattern 152 is 30 nm and the thickness 154T of the upper absorption pattern 154 has values close to 9.5 nm, 16.5 nm, 24 nm, 31 nm, and 38 nm.

According to some embodiments of the inventive concept, the thickness 154T of the upper absorption pattern 154 may be adjusted to satisfy the phase difference condition (of about 180° to about 250°) and the optical density condition (OD≥2.8) for the black border region BA. As an example, the thickness 154T of the upper absorption pattern 154 may be adjusted to have a value, which meets the optical density condition within a range of about 8 nm to about 35 nm. Since the phase shift patterns 150 is configured to meet the optical density condition, the mask contrast property of the phase shift mask 500 may be improved.

Figure 8:
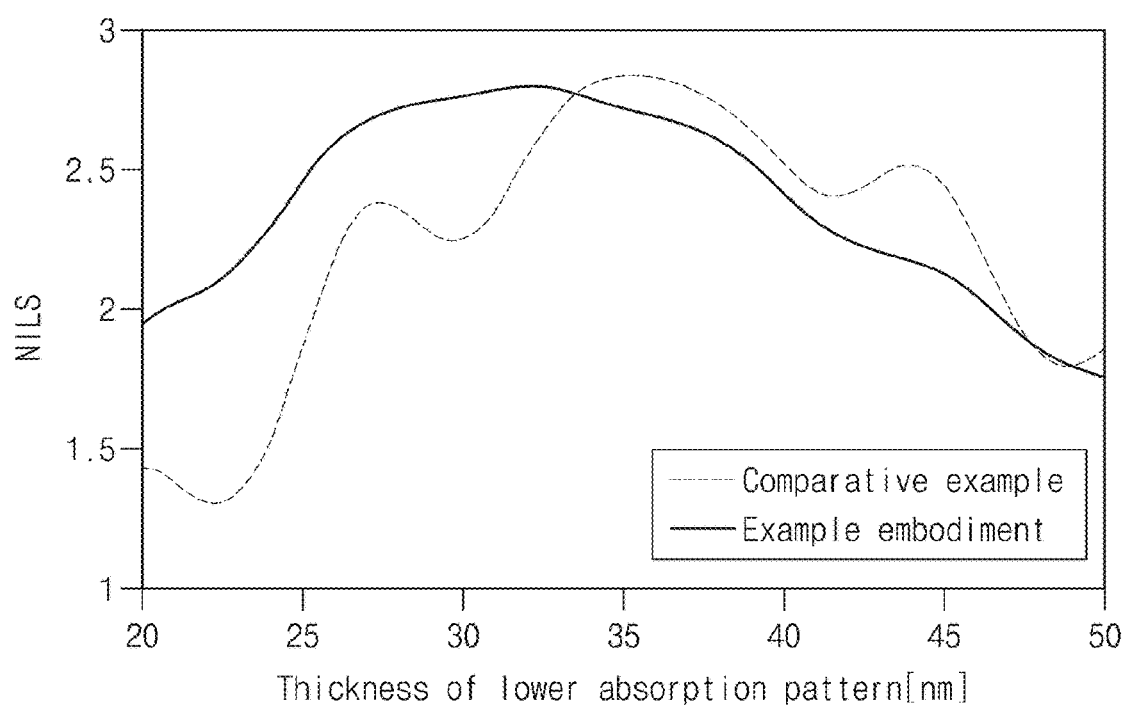
FIG. 8 is a graph showing a normalized-image-log-slope (NISL) property versus a thickness of a lower absorption pattern of a phase shift mask, according to some embodiments of the inventive concept.

FIG. 8 is a graph showing a normalized-image-log-slope (NISL) property versus a thickness of a lower absorption pattern of a phase shift mask, according to some embodiments of the inventive concept. In FIG. 8, i) the solid line represents a change in the NISL property, which is caused by a change in the thickness 152T of the lower absorption pattern 152, when the thickness 154T of the upper absorption pattern 154 is 9.5 nm, and ii) the dotted line represents a change in the NISL property, which is caused by a change in the thickness 152T of the lower absorption pattern 152 when the upper absorption pattern 154 is not provided.

Referring to FIGS. 4 and 8, a refractive index (n) of the lower absorption pattern 152 may be smaller than a refractive index (n) of the upper absorption pattern 154, and the thickness 152T of the lower absorption pattern 152 may be greater than the thickness 154T of the upper absorption pattern 154. In other words, the lower absorption pattern 152 having a relatively low refractive index (n) may be provided to be thicker than the upper absorption pattern 154 having a relatively high refractive index (n).

According to some embodiments of the inventive concept, the thickness 152T of the lower absorption pattern 152 may be adjusted to meet the phase difference condition (about 180° to about 250°) and to alter the phase shift mask 500 to have a desired NISL property. As an example, the thickness 152T of the lower absorption pattern 152 may range from about 10 nm to about 40 nm. Referring to FIG. 8, when the thickness 152T of the lower absorption pattern 152 is smaller than or equal to about 40 nm, the phase shift mask 500 according to some embodiments of the inventive concept may have an improved (or a higher) or equivalent NILS property, compared with the NILS property (e.g., of the dotted line) of a phase shift mask, in which the upper absorption pattern 154 is not provided on the lower absorption pattern 152. Since the phase shift patterns 150 are configured to meet a desired (a higher) NISL property, the phase shift mask 500 capable of easily realizing a high-resolution image may be provided.

FIGS. 9 to 12 are sectional views illustrating a method of fabricating a phase shift mask according to some embodiments of the inventive concept. For concise description, an element of the phase shift mask described with reference to FIGS. 2 to 4 may be identified by the same reference number without repeating an overlapping description thereof.

Figure 9:
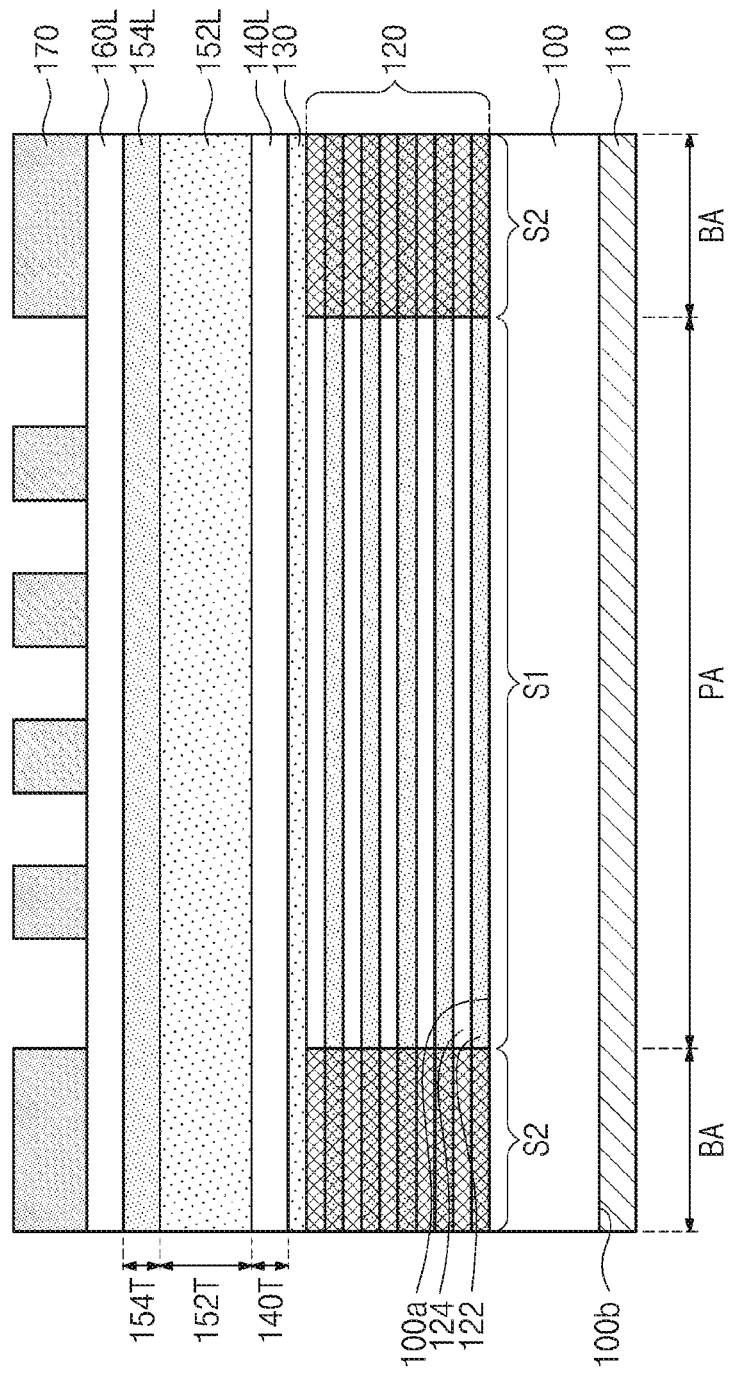

Referring to FIG. 9, the substrate 100 may be provided. The substrate 100 may be formed of or include a material having a low thermal expansion coefficient. As an example, the substrate 100 may be formed of or include glass or silicon. The substrate 100 may include the pattern region PA and the black border region BA described with reference to FIGS. 1 and 2.

The lower conductive layer 110 may be formed on the second surface 100b of the substrate 100. The lower conductive layer 110 may include, for example, a CrN layer which is formed by a sputtering deposition process.

The reflection layer 120 may be formed on the first surface 100a of the substrate 100. The formation of the reflection layer 120 may include alternately and repeatedly forming the low and high refractive index layers 122 and 124 on the first surface 100a of the substrate 100. The reflection layer 120 may be formed to have 40-60 low refractive index layers 122 and 40-60 high refractive index layers 124, which are alternately stacked by, for example, the sputtering deposition process. In some embodiments, the formation of the reflection layer 120 may include performing a laser annealing process on the black border region BA. In this case, the low and high refractive index layers 122 and 124 on the black border region BA may be intermixed with each other by the laser annealing process. Accordingly, the reflection layer 120 may have the multi-layered structure S1, in which the low and high refractive index layers 122 and 124 are alternately stacked, on the pattern region PA, and may have an intermixed structure S2, in which the low and high refractive index layers 122 and 124 are intermixed with each other, on the black border region BA.

The capping layer 130 may be formed on the reflection layer 120. The capping layer 130 may include, for example, ruthenium, and may be formed by a sputtering deposition process.

A buffer layer 140L may be formed on the capping layer 130. The buffer layer 140L may be formed of or include a material having an etch selectivity with respect to the capping layer 130. In addition, the buffer layer 140L may be formed of or include a material having an etch selectivity with respect to a lower absorption layer 152L, which will be described below. For example, the buffer layer 140L may be formed of or include silicon, silicon oxide, silicon nitride, silicon oxynitride, tantalum oxide, and/or tantalum oxynitride. The buffer layer 140L may be formed by, for example, a chemical vapor deposition process, a sputtering deposition process, or the like.

The lower absorption layer 152L may be formed on the buffer layer 140L. The lower absorption layer 152L may be formed of or include the same metallic element (e.g., ruthenium) as the capping layer 130. The lower absorption layer 152L may be formed of or include, for example, ruthenium, ruthenium alloys, ruthenium oxide, ruthenium nitride, and/or ruthenium oxynitride. The lower absorption layer 152L may be formed by, for example, a sputtering deposition process. The lower absorption layer 152L may be formed to have the thickness 152T that is greater than the thickness 140T of the buffer layer 140L.

An upper absorption layer 154L may be formed on the lower absorption layer 152L. The upper absorption layer 154L may be formed of a material whose refractive index is higher than that of the lower absorption layer 152L. In addition, the upper absorption layer 154L may be formed of a material whose extinction coefficient is larger than that of the lower absorption layer 152L. As an example, the upper absorption layer 154L may be formed of or include tantalum alloys and/or tantalum nitride. The upper absorption layer 154L may be formed by, for example, a sputtering deposition process. The upper absorption layer 154L may be formed to have the thickness 154T that is smaller than the thickness 152T of the lower absorption layer 152L. According to some embodiments, the thickness 154T of the upper absorption layer 154L and the thickness 152T of the lower absorption layer 152L may be adjusted to meet the conditions (e.g., on the phase difference condition, the optical density (OD), and the NILS property) described with reference to FIGS. 5 to 8. As an example, the thickness 154T of the upper absorption layer 154L may be within the range of about 8 nm to about 35 nm, and the thickness 152T of the lower absorption layer 152L may be within the range of about 10 nm to about 40 nm.

A hard mask layer 160L may be formed on the upper absorption layer 154L. The hard mask layer 160L may be formed of or include a material having an etch selectivity with respect to the upper absorption layer 154L and the lower absorption layer 152L. The hard mask layer 160L may be formed of or include, for example, silicon, silicon oxide, silicon nitride, silicon oxynitride, tantalum oxide, and/or tantalum oxynitride. In some embodiments, the hard mask layer 160L may be formed of or include the same material as the buffer layer 140L. The hard mask layer 160L may be formed by, for example, a chemical vapor deposition process, a sputtering deposition process, or the like.

Photoresist patterns 170 may be formed on the hard mask layer 160L. The photoresist patterns 170 may define shapes and positions of regions, in which phase shift patterns to be described below will be formed.

Figure 10:
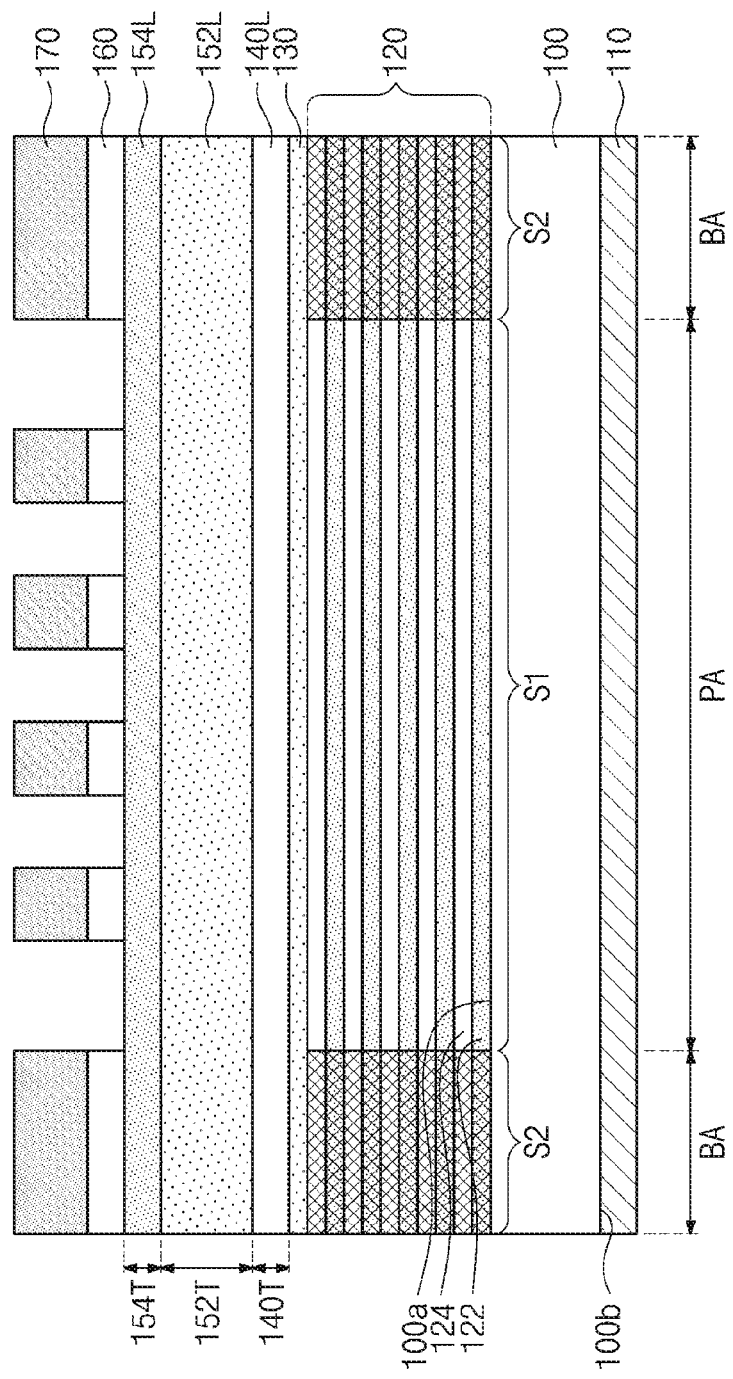

Referring to FIG. 10, the hard mask layer 160L may be etched using the photoresist patterns 170 as an etch mask. Accordingly, hard mask patterns 160 may be formed on the upper absorption layer 154L. In some embodiments, the formation of the hard mask patterns 160 may include etching the hard mask layer 160L using an etching source (e.g., containing $SF_6$, $CF_4$, and/or $CHF_3$). The term "etching source," as used herein, refers to an etchant.

Figure 11:
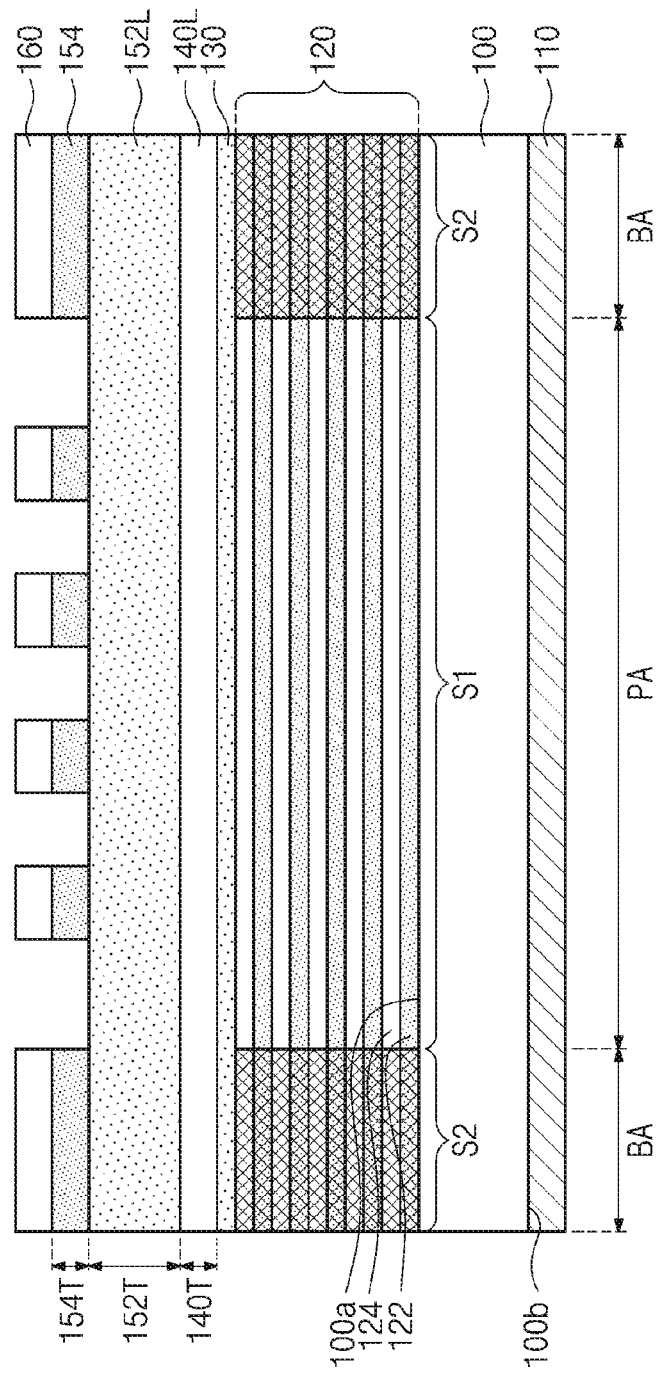

Referring to FIG. 11, the photoresist patterns 170 may be removed. The photoresist patterns 170 may be removed by, for example, an ashing and/or stripping process. The upper absorption layer 154L may be etched using the hard mask patterns 160 as etch mask. Accordingly, the upper absorption patterns 154 may be formed on the lower absorption layer 152L. In some embodiments, the formation of the upper absorption patterns 154 may include etching the upper absorption layer 154L using an etching source (e.g., containing $Cl_2$).

Referring to FIG. 12, the lower absorption layer 152L may be etched using the hard mask patterns 160 as an etch mask. Accordingly, the lower absorption patterns 152 may be formed on the buffer layer 140L. The lower absorption patterns 152 and the upper absorption patterns 154 may constitute the phase shift patterns 150. Each of the phase shift patterns 150 may include a pair of the lower and upper absorption patterns 152 and 154, which are sequentially stacked on the buffer layer 140L. In some embodiments, the formation of the lower absorption patterns 152 may include etching the lower absorption layer 152L using an etching source (e.g., containing $CL_2$ and $O_2$). The buffer layer 140L may be used as an etch stop layer, during the formation of the lower absorption layer 152L. Accordingly, the capping layer 130 may be protected during the etching of the lower absorption layer 152L.

Referring back to FIG. 3, the buffer layer 140L may be etched using the phase shift patterns 150 as an etch mask. Accordingly, the buffer patterns 140 may be formed on the capping layer 130. Each of the buffer patterns 140 may be interposed between each of the phase shift patterns 150 and the capping layer 130. In some embodiments, the formation of the buffer patterns 140 may include etching the buffer layer 140L using an etching source (e.g., containing $SF_6$, $CF_4$, and/or $CHF_3$). The hard mask patterns 160 may be removed during the etching of the buffer layer 140L.

According to some embodiments of the inventive concept, phase shift patterns may include a lower absorption pattern and an upper absorption pattern. The upper absorption pattern may be disposed on the lower absorption pattern and may have a higher refractive index than that of the lower absorption pattern, and in this case, it may be possible to reduce an amount of an extreme ultraviolet light, which is incident into the phase shift patterns and is reflected from surfaces of the phase shift patterns. This may improve a mask contrast property of a phase shift mask.

In addition, the lower absorption pattern having a relatively low refractive index may be thicker than the upper absorption pattern, and thus, it may be possible to increase a phase shift of an extreme ultraviolet light which is reflected through the phase shift patterns. Accordingly, it may be easy to realize a high-resolution image using the phase shift mask.

Thus, a phase shift mask, which has an improved mask contrast property and can realize a high-resolution image, may be used in an extreme ultraviolet lithography process.

While example embodiments of the inventive concept have been particularly shown and described, it will be understood by one of ordinary skill in the art that variations in form and detail may be made therein without departing from the scope of the attached claims.

The above-disclosed subject matter is to be considered illustrative, and not restrictive, and the appended claims are intended to cover all such modifications, enhancements, and other embodiments, which fall within the true spirit and scope of the inventive concept. Accordingly, the scope of the attached claims shall not be restricted or limited by the foregoing detailed description.

What is claimed is:

1. A phase shift mask for an extreme ultraviolet lithography process, comprising:
    a substrate;
    a reflection layer on the substrate;
    a capping layer on the reflection layer; and
    phase shift patterns on the capping layer,
    wherein each of the phase shift patterns comprises:
        a lower absorption pattern on the capping layer; and
        an upper absorption pattern on the lower absorption pattern,
        wherein a refractive index of the upper absorption pattern is higher than a refractive index of the lower absorption pattern, and
        a thickness of the upper absorption pattern is smaller than a thickness of the lower absorption pattern.

2. The phase shift mask of claim 1, wherein an extinction coefficient of the upper absorption pattern is greater than an extinction coefficient of the lower absorption pattern.

3. The phase shift mask of claim 2, further comprising an opening that is between two of the phase shift patterns and exposes the capping layer,
    wherein the phase shift patterns are configured to alter a first portion of an extreme ultraviolet light to have a phase difference of 180° to 250° with respect to a second portion of the extreme ultraviolet light, the first portion of the extreme ultraviolet light passes through one of the phase shift patterns and is reflected from the reflection layer, and the second portion of the extreme ultraviolet light passes through the opening and is reflected from the reflection layer.

4. The phase shift mask of claim 2, wherein the lower absorption pattern comprises ruthenium (Ru).

5. The phase shift mask of claim 4, wherein the upper absorption pattern comprises tantalum alloys and/or tantalum nitride.

6. The phase shift mask of claim 1, wherein the thickness of the upper absorption pattern ranges from about 8 nm to about 35 nm.

7. The phase shift mask of claim 6, wherein the thickness of the lower absorption pattern ranges from about 10 nm to about 40 nm.

8. The phase shift mask of claim 1, further comprising buffer patterns on the capping layer,
    wherein each of the buffer patterns is between the capping layer and a respective one of the phase shift patterns,
    the lower absorption pattern and the capping layer comprise a same metallic element, and
    the each of the buffer patterns comprises a material different from the lower absorption pattern and the capping layer.

9. The phase shift mask of claim 1, wherein the substrate comprises a pattern region and a black border region surrounding the pattern region, and
    wherein the reflection layer has a multi-layered structure on the pattern region and an intermixed structure on the black border region, the multi-layered structure includes first portions of high refractive index layers and first portions of low refractive index layers that are alternately stacked, and the intermixed structure includes second portions of the high refractive index layers and second portions of the low refractive index layers that are intermixed with each other.

10. A phase shift mask for an extreme ultraviolet lithography process, comprising:
    a substrate;
    a reflection layer on the substrate;
    a capping layer on the reflection layer;
    buffer patterns on the capping layer; and
    phase shift patterns on the buffer patterns, respectively,
    wherein each of the phase shift patterns comprises:
        an upper absorption pattern on each of the buffer patterns; and
        a lower absorption pattern between the each of the buffer patterns and the upper absorption pattern,
        wherein the lower absorption pattern and the capping layer comprise a same metallic element,
        the upper absorption pattern has a refractive index that is higher than a refractive index of the lower absorption pattern, and
        a thickness of the upper absorption pattern is smaller than a thickness of the lower absorption pattern.

11. The phase shift mask of claim 10, wherein the upper absorption pattern has an extinction coefficient that is greater than an extinction coefficient of the lower absorption pattern.

12. The phase shift mask of claim 10, wherein the lower absorption pattern and the capping layer comprise ruthenium.

13. The phase shift mask of claim 12, wherein the upper absorption pattern comprises tantalum alloys and/or tantalum nitride.

14. The phase shift mask of claim 12, wherein the buffer patterns comprise a material different from the lower absorption pattern and the capping layer.

15. The phase shift mask of claim 14, wherein the buffer patterns comprise silicon, silicon oxide, silicon nitride, silicon oxynitride, tantalum oxide, and/or tantalum oxynitride.

16. A phase shift mask for an extreme ultraviolet lithography process, comprising:
    a substrate;
    a reflection layer on the substrate;
    a capping layer on the reflection layer; and
    phase shift patterns on the capping layer,
    wherein each of the phase shift patterns comprises:
        a lower absorption pattern on the capping layer; and an upper absorption pattern on the lower absorption pattern, wherein the lower absorption pattern comprises ruthenium (Ru), the upper absorption pattern comprises tantalum (Ta), and a thickness of the upper absorption pattern is smaller than a thickness of the lower absorption pattern.

17. The phase shift mask of claim 16, further comprising buffer patterns on the capping layer, wherein each of the buffer patterns is between the capping layer and a respective one of the phase shift patterns, the capping layer comprises ruthenium (Ru), and the each of buffer patterns comprises a material different from the lower absorption pattern and the capping layer.

18. The phase shift mask of claim 17, wherein the each of the buffer patterns comprises silicon, silicon oxide, silicon nitride, silicon oxynitride, tantalum oxide, and/or tantalum oxynitride.

19. The phase shift mask of claim 16, wherein the lower absorption pattern comprises ruthenium alloys, ruthenium oxide, ruthenium nitride, and/or ruthenium oxynitride.

20. The phase shift mask of claim 16, wherein the upper absorption pattern comprises tantalum alloys and/or tantalum nitride.

* * * * *